United States Patent
Lee (10) Patent No.: US 8,552,308 B2
(45) Date of Patent: Oct. 8, 2013

(54) DIFFERENTIAL SIGNAL PAIR TRANSMISSION STRUCTURE, WIRING BOARD AND ELECTRONIC MODULE

(75) Inventor: Sheng-Yuan Lee, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 145 days.

(21) Appl. No.: 13/275,320

(22) Filed: Oct. 18, 2011

(65) Prior Publication Data

US 2012/0243184 A1   Sep. 27, 2012

Related U.S. Application Data

(60) Provisional application No. 61/466,851, filed on Mar. 23, 2011.

(30) Foreign Application Priority Data

Jul. 7, 2011   (TW) .............................. 100124049 A (51) Int. Cl.
*H05K 1/16*   (2006.01)
(52) U.S. Cl.
USPC ............................ 174/260; 174/255; 174/262
(58) Field of Classification Search
None
See application file for complete search history.

(56) References Cited

U.S. PATENT DOCUMENTS

| 7,968,802 B2 * | 6/2011 | Pai et al. ........................ 174/262 |
| 8,013,427 B2 * | 9/2011 | Maetani ........................ 257/664 |
| 8,076,590 B2 * | 12/2011 | Zhao et al. .................... 174/262 |

FOREIGN PATENT DOCUMENTS

| TW | I259744 | 8/2006 |
| TW | 200843602 | 11/2008 |

OTHER PUBLICATIONS

"Office Action of Taiwan Counterpart Application", issued on Jun. 28, 2013, p1-p11, in which the listed references were cited.

* cited by examiner

*Primary Examiner* — Ishwarbhai Patel
(74) *Attorney, Agent, or Firm* — Jianq Chyun IP Office (57) ABSTRACT

A differential signal pair transmission structure adapted to a wiring board and including a first signal path and a second signal path is provided. The first signal path includes a first upper trace, a first lower trace and a first conductive through via. The second signal path includes a second upper trace, a second lower trace and a second conductive through via. A portion of the first signal path and a portion of the second signal path overlaps in the normal projection onto the upper or lower surface of the wiring board. Normal projections of the first and the second signal path projecting onto the upper surface of the wiring board are substantially symmetric with respect to a line which is perpendicular to a segment connecting normal projections of axes of the first and the second through via onto the upper surface and passes through the midpoint of the segment.

20 Claims, 7 Drawing Sheets

DIFFERENTIAL SIGNAL PAIR TRANSMISSION STRUCTURE, WIRING BOARD AND ELECTRONIC MODULE

CROSS-REFERENCE TO RELATED APPLICATION

This application claims the priority benefits of U.S.A. provisional application Ser. No. 61/466,851, filed on Mar. 23, 2011 and Taiwan application serial No. 100124049, filed on Jul. 7, 2011. The entirety of each of the above-mentioned patent applications is hereby incorporated by reference herein and made a part of this specification.

BACKGROUND OF THE INVENTION

1. Field of the Application

The present invention relates to a differential signal pair transmission structure, and more particularly, to a symmetric differential signal pair transmission structure and a wiring board and an electronic module utilizing the same.

2. Description of Related Art

In the semiconductor industry, it has become the tendency of the industry to develop integrated circuit (IC) elements with high integrity and high processing speed. Along with the steady advancements of integrated circuit element efficiency, the transmission frequency of electronic signals in a chip is gradually increased. However, when the frequency of an electronic signal is increased to a high-frequency status, for example, beyond a gigahertz (GHz, i.e. one thousand million hertz), the internal signals of a chip would be easily interfered by noise, so that transmission distortion caused by the noise gets more significantly. Herein crosstalk is considered as one of the most common noise interferences. In fact, crosstalk phenomenon mainly comes from a coupling between two adjacent conductors and thereby results parasitic inductance and parasitic capacitance, and the crosstalk gets more seriously with increasing wiring layout density in the IC elements.

At present, differential signal pair transmission technology is widely used to connect the integrated circuit elements and electrical connectors in high speed applications. The electrical connectors are, for example, Universal Serial Bus 3.0 (USB 3.0), Serial Advanced Technology Attachment (SATA) and Peripheral Component Interconnection Express (PCIE) and the like.

In some situations, the integrated circuit element, for example a chip, and the electrical connector are required to separately assemble on the opposite surfaces of the wiring board. When the differential signal pair paths are used to electrically connect the chip and the electrical connector, the differential signal pair paths have to pass through the wiring board and extend from a surface to the other surface of the wiring board. Since the differential signal pair polarities of the chip and the electrical connector are exactly opposite, one of the signal polarities of the differential signal pair has to detour in the wiring layout. For instance, the length of the negative signal path has to be longer than that of the positive signal path and results the dissymmetry between the two signal paths. Thus, problems of time skew would occur in differential signal pair transmission. And consequently, the high speed transmission efficiency of the differential signal pair paths would be reduced.

SUMMARY OF THE INVENTION

The present invention is directed to a differential signal pair transmission structure adapted to a wiring board and transmit a differential signal pair. The impedance mismatch and the time skew during the signal transmission within the circuit stack of the wiring board can be reduced.

The present invention is directed to a wiring board, using a differential signal pair transmission structure to transmit a differential signal pair. The impedance mismatch and the time skew during the signal transmission within the circuit stack of the wiring board can be reduced.

The present invention is directed to an electronic module using a wiring board having a differential signal pair transmission structure to transmit a differential signal pair. The impedance mismatch and the time skew during the signal transmission within the circuit stack of the wiring board can be reduced.

The present invention provides a differential signal pair transmission structure adapted to a wiring board and transmit a differential signal pair. The wiring board has a circuit stack. The circuit stack includes an upper surface and a lower surface opposing the upper surface. The differential signal pair transmission structure includes a first signal path and a second signal path. The first signal path is used to transmit one of the differential signal pair. The first signal path includes a first upper trace, a first lower trace and a first conductive through via. The first upper trace is adapted to be disposed on the upper surface. The first lower trace is adapted to be disposed on the lower surface. The first conductive through via is adapted to pass through the circuit stack and extending from the upper surface to the lower surface, and connecting an end of the first upper trace and an end of the first lower trace. The second signal path is used to transmit the other of the differential signal pair. The second signal path includes a second upper trace, a second lower trace and a second conductive through via. The second upper trace is adapted to be disposed on the upper surface. The second lower trace is adapted to be disposed on the lower surface. The second conductive through via is adapted to pass through the circuit stack and extending from the upper surface to the lower surface, and connecting an end of the second upper trace and an end of the second lower trace. A portion of the first signal path and a portion of the second signal path overlap in the normal projection onto the upper surface. And the normal projection of the first signal path and the normal projection of the second signal path projecting onto the upper surface are substantially symmetric with respect to a line which is perpendicular to a segment connecting the normal projection of axis of the first through via and the normal projection of axis of the second through via onto the upper surface and passes through the midpoint of the segment.

The present invention further provides a wiring board including a circuit stack and a differential signal pair transmission structure. The circuit stack has an upper surface and a lower surface opposing to the upper surface. The differential signal pair transmission structure includes a first signal path and a second signal path. The first signal path is used to transmit one of a differential signal pair. The first signal path includes a first upper trace, a first lower trace and a first conductive through via. The first upper trace is adapted to be disposed on the upper surface. The first lower trace is adapted to be disposed on the lower surface. The first conductive through via is adapted to pass through the circuit stack and extending from the upper surface to the lower surface, and connecting an end of the first upper trace and an end of the first lower trace. The second signal path is used to transmit the other of the differential signal pair. The second signal path includes a second upper trace, a second lower trace and a second conductive through via. The second upper trace is adapted to be disposed on the upper surface. The second lower trace is adapted to be disposed on the lower surface. The second conductive through via is adapted to pass through the circuit stack and extending from the upper surface to the lower surface, and connecting an end of the second upper trace and an end of the second lower trace. A portion of the first signal path and a portion of the second signal path overlap in the normal projection onto the upper surface. And the normal projection of the first signal path and the normal projection of the second signal path projecting onto the upper surface are substantially symmetric with respect to a line which is perpendicular to a segment connecting the normal projection of axis of the first through via and the normal projection of axis of the second through via onto the upper surface and passes through the midpoint of the segment.

The present invention further provides an electronic module including a wiring board, an integrated circuit element and an electrical connector. The wiring board includes a circuit stack having an upper surface and a lower surface opposing to the upper surface. The differential signal pair transmission structure includes a first signal path and a second signal path. The first signal path is used to transmit one of a differential signal pair. The first signal path includes a first upper trace, a first lower trace and a first conductive through via. The first upper trace is adapted to be disposed on the upper surface. The first lower trace is adapted to be disposed on the lower surface. The first conductive through via is adapted to pass through the circuit stack and extending from the upper surface to the lower surface, and connecting an end of the first upper trace and an end of the first lower trace. The second signal path is used to transmit the other of the differential signal pair. The second signal path includes a second upper trace, a second lower trace and a second conductive through via. The second upper trace is adapted to be disposed on the upper surface. The second lower trace is adapted to be disposed on the lower surface. The second conductive through via is adapted to pass through the circuit stack and extending from the upper surface to the lower surface, and connecting an end of the second upper trace and an end of the second lower trace. A portion of the first signal path and a portion of the second signal path overlap in the normal projection onto the upper surface. And the normal projection of the first signal path and the normal projection of the second signal path projecting onto the upper surface are substantially symmetric with respect to a line which is perpendicular to a segment connecting the normal projection of axis of the first through via and the normal projection of axis of the second through via onto the upper surface and passes through the midpoint of the segment. The integrated circuit element is assembled on the upper surface, and electrically connected to the other end of the first upper trace and the other end of the second upper trace. The electrical connector is assembled to the lower surface, and electrically connected to the other end of the first lower trace and the other end of the second lower trace.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
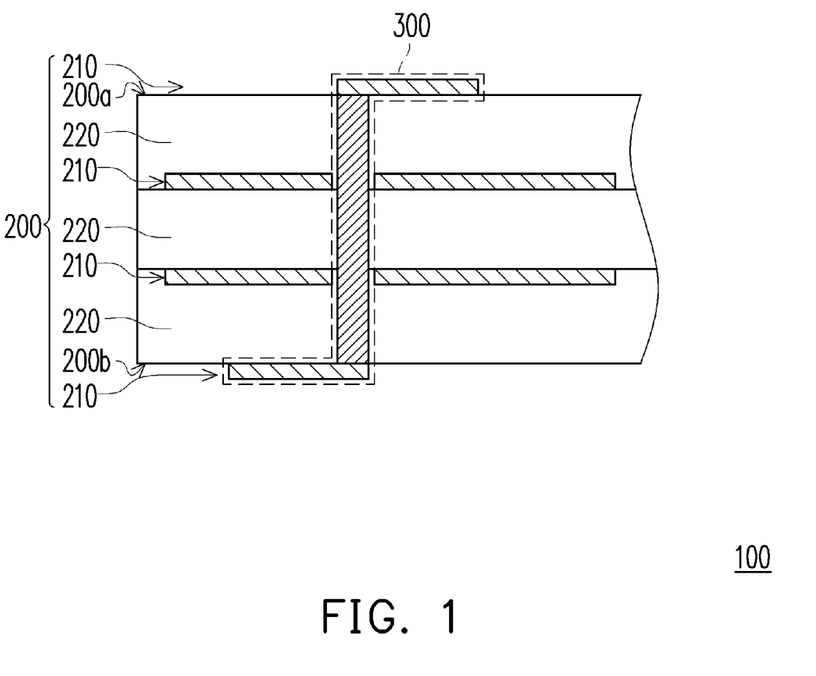
FIG. 1 is a cross-sectional view of a wiring board according to an embodiment of the present invention.

FIG. 1 is a cross-sectional view of a wiring board according to an embodiment of the present invention. Referring to FIG. 1, the wiring board 100 includes a circuit stack 200 and a differential signal pair transmission structure 300. The circuit stack 200 has an upper surface 200a and a lower surface 200b opposing to the upper surface 200a. The circuit stack 200 includes a plurality of patterned conductive layers 210 and a plurality of dielectric layers 220. The dielectric layers 220 are alternately disposed with the patterned conductive layers 210. Terminologies such as "upper" of the upper surface 200a and "lower" of the lower surface 200b are applicable to the embodiments shown and described in conjunction with the drawings. These terminologies are merely for the purposes of description and do not necessarily applied to the position or manner in which the invention may be constructed for actual use.

In the embodiment, a structure of three layers of the dielectric layers 220 alternately disposing with four layers of the patterned conductive layers 210 is shown as an example of the circuit stack 200. However, the numbers of the patterned conductive layers 210 and the dielectric layers 220 included in the circuit stack 200 are not limited in the present invention, and the user can design the circuit stack 200 as required. In addition, the material of the dielectric layer 220 of the present embodiment is, for example but not limited to, resin.

Figure 2A:
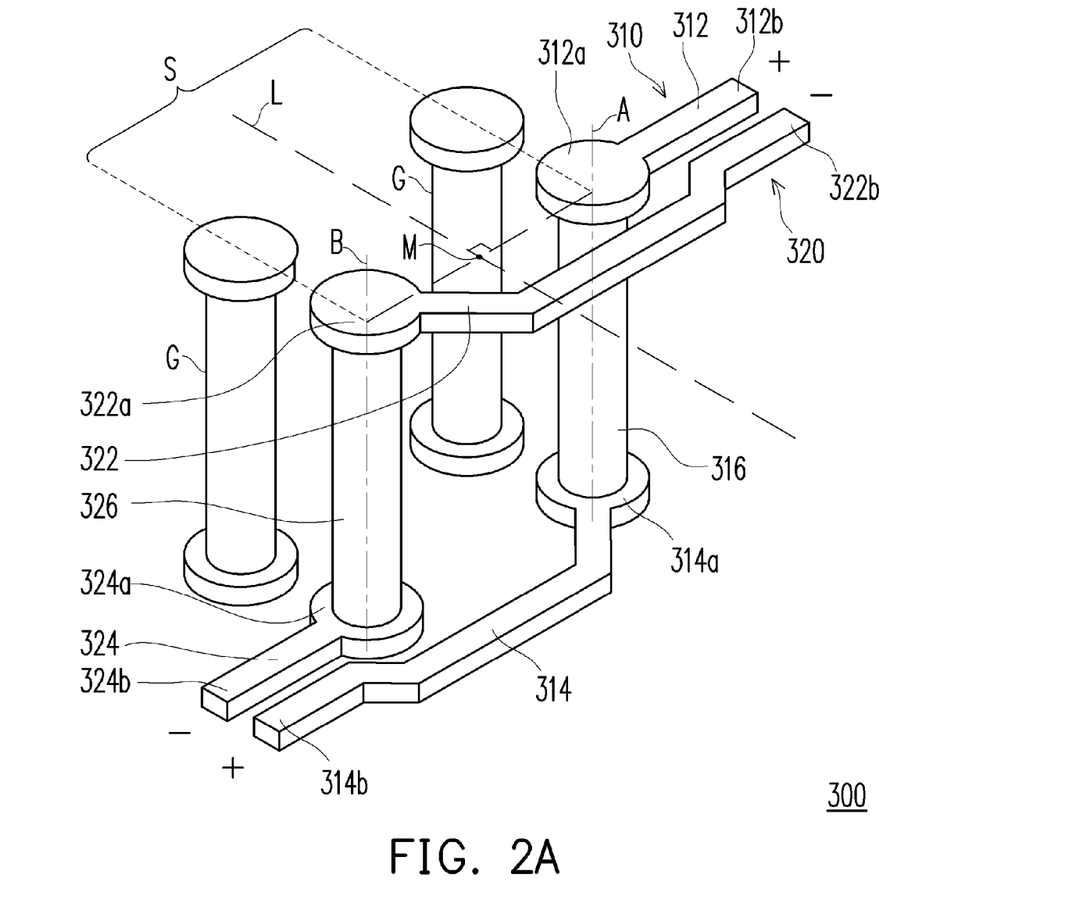
FIG. 2A is a perspective view of the differential signal pair transmission structure of the wiring board in FIG. 1.
Figure 2B:
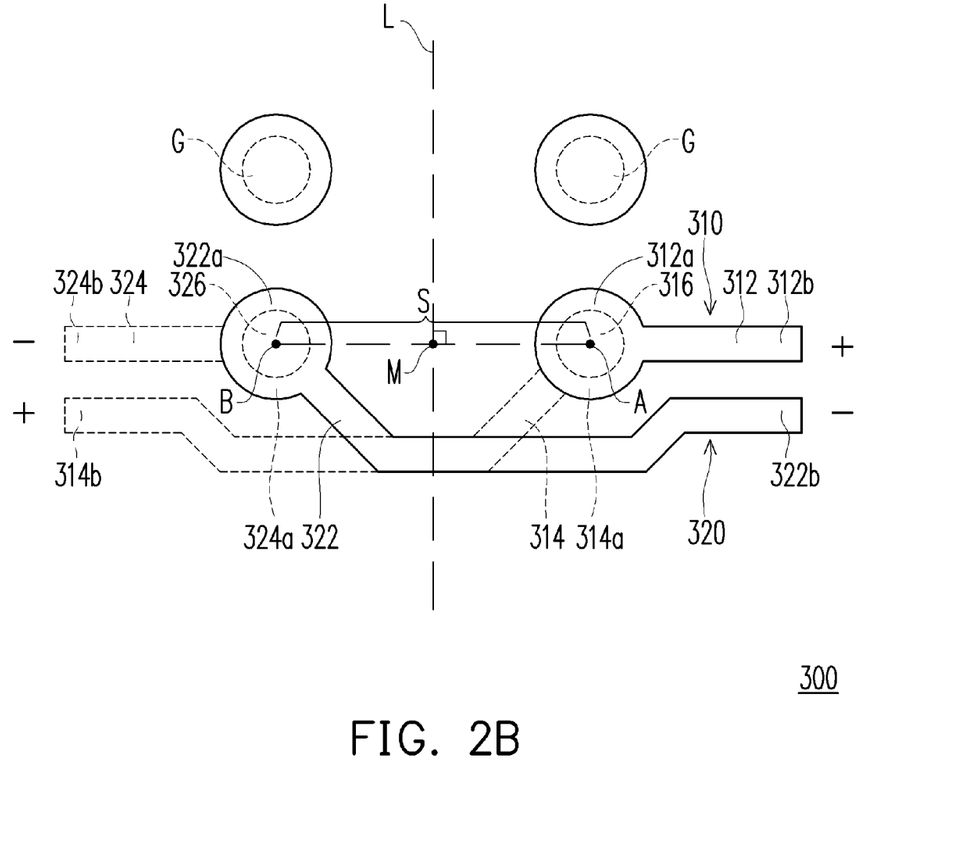
FIG. 2B is a top view of the differential signal pair transmission structure in FIG. 2A.

FIG. 2A is a perspective view of the differential signal pair transmission structure of the wiring board in FIG. 1. FIG. 2B is a top view of the differential signal pair transmission structure in FIG. 2A. Referring to FIG. 1, FIG. 2A and FIG. 2B, the differential signal pair transmission structure 300 includes a first signal path 310 and a second signal path 320.

The first signal path 310 is used to transmit one of a differential signal pair. In this embodiment, for example, the first signal path 310 transmits a positive signal. The first signal path 310 includes a first upper trace 312, a first lower trace 314 and a first conductive through via 316. The first upper trace 312 is adapted to be disposed on the upper surface 200a. The first lower trace 314 is adapted to be disposed on the lower surface 200b. The first conductive through via 316 is adapted to pass through the circuit stack 200 and extending from the upper surface 200a to the lower surface 200b, and connecting an end 312a of the first upper trace 312 and an end 314a of the first lower trace 314.

The second signal path 320 is used to transmit one of the differential signal pair. In this embodiment, for example, the second signal path 320 transmits a negative signal. The second signal path 320 includes a second upper trace 322, a second lower trace 324 and a second conductive through via 326. The second upper trace 322 is adapted to be disposed on the upper surface 200a. The second lower trace 324 is adapted to be disposed on the lower surface 200b. The second conductive through via 326 is adapted to pass through the circuit stack 200 and extending from the upper surface 200a to the lower surface 200b, and connecting an end 322a of the second upper trace 322 and an end 324a of the second lower trace 324.

In the embodiment, a portion of the patterned conductive layer 210 located on the upper surface 200a constitutes the first upper trace 312 and the second upper trace 322, and a portion of the patterned conductive layer 210 located on the lower surface 200b constitutes the first lower trace 314 and the second lower trace 324. Terminologies such as "upper" of the first upper trace 312 and the second upper trace 322, and "lower" of the first lower trace 314 and the second lower trace 324 are applicable to the embodiments shown and described in conjunction with the drawings. These terminologies are merely for the purposes of description and do not necessarily applied to the position or manner in which the invention may be constructed for actual use.

In the embodiment, in order to ensure the good quality in high speed transmission of the differential signal pair transmission structure 300, the differential signal pair transmission structure 300 is designed to be a symmetrical structure, so that the lengths of the first signal path 310 and the second signal path 320 are substantially equal.

Referring to FIG. 2B, the positions of the first lower trace 314 and the second lower trace 324 of the differential signal pair transmission structure 300 are illustrated in dotted lines, while the positions of the first upper trace 312 and the second upper trace 322 of the differential signal pair transmission structure 300 are illustrated in continuous lines. When the first lower trace 314 is close to the second conductive through via 326 on the lower surface 200b, the first lower trace 314 detours a portion of the second conductive through via 326 located on the lower surface 200b. When the second upper trace 322 is close to the first conductive through via 316 on the upper surface 200a, the second upper trace 322 detours a portion of the first conductive through via 316 located on the upper surface 200a. And thus, the normal projections of the first signal path 310 and the second signal path 320 on the upper surface 200a may partially overlap.

Referring to FIG. 2B, the normal projection of the first signal path 310 and the normal projection of the second signal path 320 projecting onto the upper surface 200a are substantially symmetric with respect to a line L which is perpendicular to a segment S connecting the normal projection of axis A of the first through via 316 and the normal projection of axis B of the second through via 326 onto the upper surface 200a and passes through the midpoint M of the segment S. In other words, the segment S connects the normal projection of axis A of the first through via 316 and the normal projection of axis B of the second through via 326. The line L is perpendicular to the segment S and passes through the midpoint M of the segment S. And the normal projection of the first signal path 310 and the normal projection of the second signal path 320 projecting onto the upper surface 200a are substantially symmetric with respect to the line L.

According to the differential signal pair transmission technique, the signal polarities of the first signal path 310 and the second signal path 320 are different. In this embodiment, the first signal path 310 transmits a positive signal, and the second signal path 320 transmits a negative signal, for example.

It has to be noted that since the differential signal pair transmission structure 300 is symmetrical in structure as shown in FIG. 2A, the signal polarity (positive-negative, right side of FIG. 2B) of the differential signal pair transmission structure 300 located on the upper surface 200a is exactly opposite to the signal polarity (negative-positive, left side of FIG. 2B) of the differential signal pair transmission structure 300 located on the lower surface 200b.

In order to ensure the stability of signal transmission, the wiring board 200 further includes at least a ground through via G disposed nearby the first conductive through via 316 or the second conductive through via 326. In the embodiment as shown in FIG. 2B, the two ground through via G are respectively located nearby the first conductive through via 316 and the second conductive through via 326 so as to increase the signal transmission efficiency.

Figure 3:
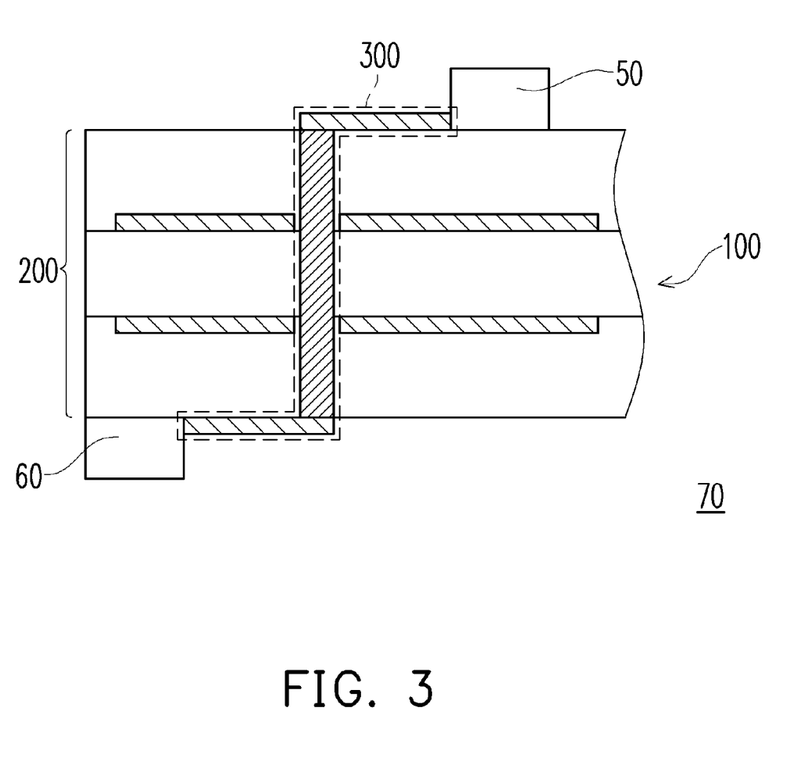
FIG. 3 is a cross-sectional view of an electronic module according to an embodiment of the present invention.

FIG. 3 is a cross-sectional view of an electronic module according to an embodiment of the present invention. Referring to FIG. 1, FIG. 2A and FIG. 3, the electronic module 70 includes a wiring board 100, an integrated circuit element 50 and an electrical connector 60. The integrated circuit element 50 is assembled on the upper surface 200a of the circuit stack 200 of the wiring board 100, and electrically connected to the other end 312b of the first upper trace 312 and the other end 322b of the second upper trace 322. The electrical connector 60 is assembled on the lower surface 200b of the circuit stack 200 of the wiring board 100, and electrically connected to the other end 314b of the first lower trace 314 and the other end 324b of the second lower trace 324.

In the embodiment, the electronic module 70 utilizes a high speed signal transmission interface, and the integrated circuit element 50 is the control chip of the high speed signal transmission interface and the electrical connector 60 is the electrical connector of the high speed signal transmission interface, for example. The high speed signal transmission interfaces are, for example, Universal Serial Bus 3.0 (USB 3.0), Serial Advanced Technology Attachment (SATA) and Peripheral Component Interconnection Express (PCIE), etc. In addition, the electrical connector 60 is not limited to be the conventional electrical connector, and it can also be a set of goldfingers of the wiring board 100.

Then, results and comparisons of the computer simulation of the symmetric differential signal pair transmission structure 300 of the embodiment (FIG. 2B) and a conventional and asymmetric differential signal pair transmission structure 400 (FIG. 4) are described as follows.

Figure 4:
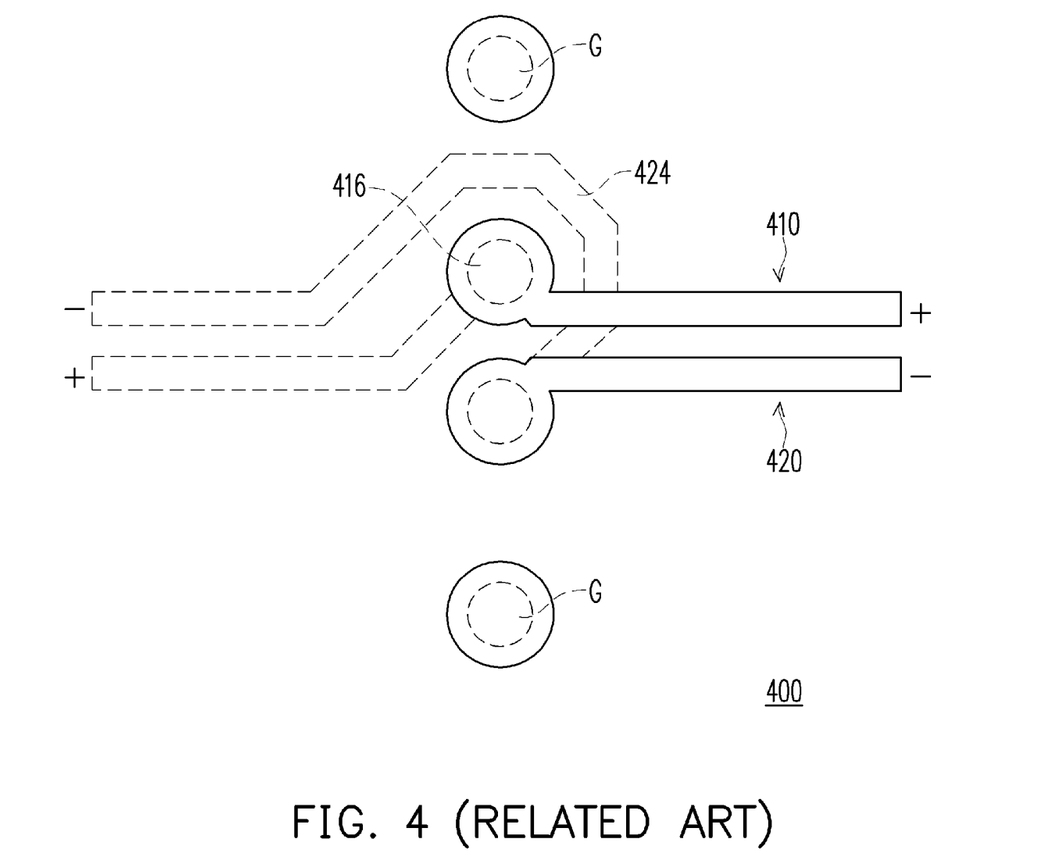
FIG. 4 is a top view of a conventional and asymmetric differential signal pair transmission structure.

FIG. 4 is a top view of a conventional and asymmetric differential signal pair transmission structure. Referring to FIG. 4, the differential signal pair transmission structure 400 includes a first signal path 410 and a second signal path 420. In order to let the signal polarity of the bottom of differential signal pair transmission structure 400 to be negative-positive (left side of FIG. 4) while the signal polarity of the top is positive-negative (right side of FIG. 4), the lower trace 424 of the second signal path 420 has to detour the whole conductive through via 416 of the first signal path 410 and thus it results the lengths of the first signal path 410 and the second signal path 420 being unequal.

The following computer simulation results show the different signal transmission efficiencies between the symmetric differential signal pair transmission structure 300 of the embodiment (FIG. 2B) and a conventional and asymmetric differential signal pair transmission structure 400 (FIG. 4).

Figure 5:
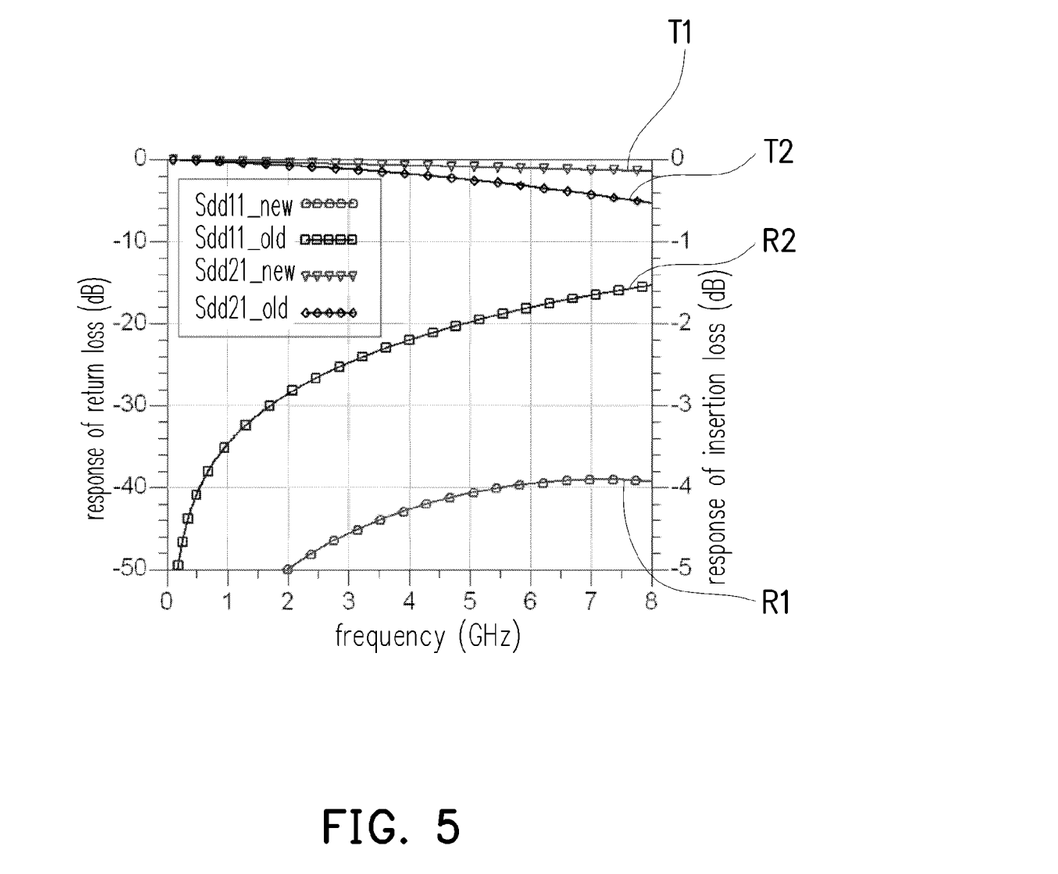
FIG. 5 is a diagram illustrating Response versus Frequency of the insertion loss and the return loss of the differential signal pair transmission structures in FIG. 2B and FIG. 4.

FIG. 5 is a diagram illustrating Response versus Frequency of the insertion loss and the return loss of the differential signal pair transmission structures in FIG. 2B and FIG. 4. Referring to FIG. 5, regarding the computer simulation results of insertion loss, the insertion loss (the curve T1 in FIG. 5) of the differential signal pair transmission structure 300 in FIG. 2B is smaller than the insertion loss (the curve T2 in FIG. 5) of the conventional differential signal pair transmission structure 400 in FIG. 4. It means at the same frequency, the value of the insertion loss of the differential signal pair transmission structure 300 (the curve T1 in FIG. 5) is closer to zero than that of the conventional differential signal pair transmission structure 400 (the curve T2 in FIG. 5). Moreover, regarding the computer simulation results of return loss, the return loss (the curve R1 in FIG. 5) of the differential signal pair transmission structure 300 is larger than the return loss (the curve R2 in FIG. 5) of the conventional differential signal pair transmission structure 400. It means at the same frequency, the value of the return loss (the curve R1 in FIG. 5) of the differential signal pair transmission structure 300 is further away zero than that (the curve R2 in FIG. 5) of the conventional differential signal pair transmission structure 400. Thus, comparing with the conventional differential signal pair transmission structure 400, the differential signal pair transmission structure 300 of the embodiment has a better signal transmission efficiency.

Figure 6A:
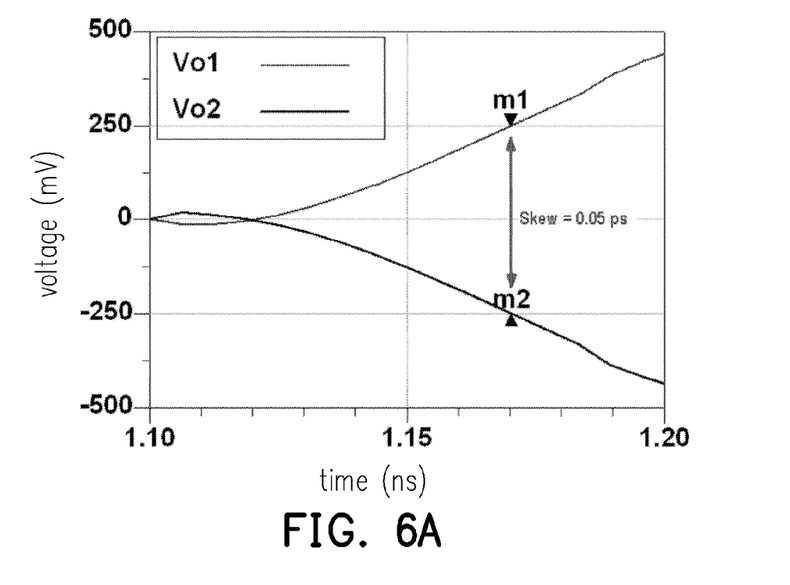
FIG. 6A is a diagram illustrating Voltage versus Time of the differential signal pair transmission structure in FIG. 2B.
Figure 6B:
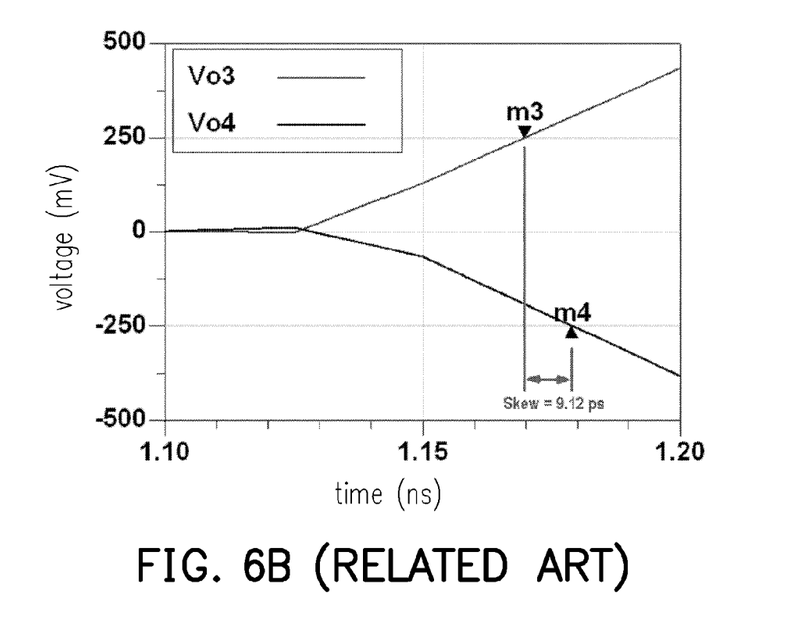
FIG. 6B is a diagram illustrating Voltage versus Time of the conventional differential signal pair transmission structure in FIG. 4.

FIG. 6A is a diagram illustrating Voltage versus Time of the differential signal pair transmission structure in FIG. 2B, and FIG. 6B is a diagram illustrating Voltage versus Time of the conventional differential signal pair transmission structure in FIG. 4. Referring to FIG. 6A, the difference between the time m1 when the positive signal voltage reaches 250 mV (mili volt) and the time m2 when the negative signal voltage reaches −250 mV (mili volt) during the signal transmitting in the differential signal pair transmission structure 300 of the embodiment in FIG. 2B is 0.05 ps (pico second). Referring to FIG. 6B, the difference between the time m3 when the positive signal voltage reaches 250 mV (mili volt) and the time m4 when the negative signal voltage reaches −250 mV (mili volt) during the signal transmitting in the conventional differential signal pair transmission structure 400 in FIG. 4 is 9.12 ps (pico second). Thus, regarding the time skew, the differential signal pair transmission structure 300 of the embodiment is better than the conventional differential signal pair transmission structure 400.

In light of the foregoing, a differential signal pair transmission structure having a symmetrical structure is used to transmit a differential signal pair in the present invention. Since the positive signal path and the negative signal path of the differential signal pair transmission structure of the present invention are in a symmetric geometrical shape, so that the total extension lengths of the signal paths are substantially equal, and thus the impedance mismatch and the time skew during the signal transmission can be reduced. Thus, the differential signal pair transmission structure can be utilized in the wiring board and the electronic module, especially for the electronic module in which a high speed signal transmission is required, so as to improve the signal transmission efficiency. Furthermore, the differential signal pair transmission structure has a simple and miniature layout, and thus the area of the wiring board can be saved so as to reduce the manufacturing cost.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A differential signal pair transmission structure adapted to be disposed on a wiring board and transmit a differential signal pair, the wiring board including a circuit stack and the circuit stack comprising an upper surface and a lower surface opposing the upper surface, the differential signal pair transmission structure comprising:
   a first signal path used to transmit one of the differential signal pair, the first signal path comprising:
      a first upper trace adapted to be disposed on the upper surface;
      a first lower trace adapted to be disposed on the lower surface; and
      a first conductive through via adapted to pass through the circuit stack and extending from the upper surface to the lower surface, and connecting an end of the first upper trace and an end of the first lower trace; and
   a second signal path used to transmit the other of the differential signal pair, the second signal path comprising:
      a second upper trace adapted to be disposed on the upper surface;
      a second lower trace adapted to be disposed on the lower surface; and
      a second conductive through via adapted to pass through the circuit stack and extending from the upper surface to the lower surface, and connecting an end of the second upper trace and an end of the second lower trace,
   wherein a portion of the first signal path and a portion of the second signal path overlap in the normal projection onto the upper surface, and the normal projection of the first signal path and the normal projection of the second signal path projecting onto the upper surface are substantially symmetric with respect to a line which is perpendicular to a segment connecting the normal projection of axis of the first through via and the normal projection of axis of the second through via onto the upper surface and passes through the midpoint of the segment.

2. The differential signal pair transmission structure as claimed in claim 1, wherein the first lower trace partially detours a portion of the second conductive through via located at the lower surface, and the second upper trace partially detours a portion of the first conductive through via located at the upper surface.

3. The differential signal pair transmission structure as claimed in claim 1, further comprising at least a ground through via disposed nearby the first conductive through via.

4. The differential signal pair transmission structure as claimed in claim 1, further comprising at least a ground through via disposed nearby the second conductive through via.

5. A wiring board, comprising:
   a circuit stack having an upper surface and a lower surface opposing the upper surface; and
   a differential signal pair transmission structure, comprising:
      a first signal path used to transmit one of a differential signal pair, the first signal path comprising:
         a first upper trace disposed on the upper surface;
         a first lower trace disposed on the lower surface; and
         a first conductive through via passing through the circuit stack and extending from the upper surface to the lower surface, and connecting an end of the first upper trace and an end of the first lower trace; and
      a second signal path used to transmit the other of the differential signal pair, the second signal path comprising:
         a second upper trace disposed on the upper surface;

a second lower trace disposed on the lower surface; and a second conductive through via passing through the circuit stack and extending from the upper surface to the lower surface, and connecting an end of the second upper trace and an end of the second lower trace, wherein a portion of the first signal path and a portion of the second signal path overlap in the normal projection onto the upper surface, and the normal projection of the first signal path and the normal projection of the second signal path projecting onto the upper surface are substantially symmetric with respect to a line which is perpendicular to a segment connecting the normal projection of axis of the first through via and the normal projection of axis of the second through via onto the upper surface and passes through the midpoint of the segment.

6. The wiring board as claimed in claim 5, wherein the first lower trace partially detours a portion of the second conductive through via located at the lower surface, and the second upper trace partially detours a portion of the first conductive through via located at the upper surface.

7. The wiring board as claimed in claim 5, further comprising at least a ground through via disposed nearby the first conductive through via.

8. The wiring board as claimed in claim 5, further comprising at least a ground through via disposed nearby the second conductive through via.

9. The wiring board as claimed in claim 5, wherein the circuit stack comprises:

a plurality of patterned conductive layers; and a plurality of dielectric layers alternately disposed with the patterned conductive layers, wherein a portion of the patterned conductive layer located on the upper surface constitutes the first upper trace and the second upper trace, and a portion of the patterned conductive layer located on the lower surface constitutes the first lower trace and the second lower trace.

10. The wiring board as claimed in claim 9, wherein materials of the dielectric layers are resin.

11. An electronic module, comprising:

a wiring board, comprising:

a circuit stack having an upper surface and a lower surface opposing the upper surface; and a differential signal pair transmission structure, comprising:

a first signal path used to transmit one of a differential signal pair, the first signal path comprising:

a first upper trace disposed on the upper surface;

a first lower trace disposed on the lower surface; and a first conductive through via passing through the circuit stack and extending from the upper surface to the lower surface, and connecting an end of the first upper trace and an end of the first lower trace; and a second signal path used to transmit the other of the differential signal pair, the second signal path comprising:

a second upper trace disposed on the upper surface;

a second lower trace disposed on the lower surface; and a second conductive through via passing through the circuit stack and extending from the upper surface to the lower surface, and connecting an end of the second upper trace and an end of the second lower trace, wherein a portion of the first signal path and a portion of the second signal path overlap in the normal projection onto the upper surface, and the normal projection of the first signal path and the normal projection of the second signal path projecting onto the upper surface are substantially symmetric with respect to a line which is perpendicular to a segment connecting the normal projection of axis of the first through via and the normal projection of axis of the second through via onto the upper surface and passes through the midpoint of the segment;

an integrated circuit element assembled to the upper surface, and electrically connected to the other end of the first upper trace and the other end of the second upper trace; and an electrical connector assembled to the lower surface, and electrically connected to the other end of the first lower trace and the other end of the second lower trace.

12. The electronic module as claimed in claim 11, wherein the first lower trace partially detours a portion of the second conductive through via located at the lower surface, and the second upper trace partially detours a portion of the first conductive through via located at the upper surface.

13. The electronic module as claimed in claim 11, further comprising at least a ground through via disposed nearby the first conductive through via.

14. The electronic module as claimed in claim 11, further comprising at least a ground through via disposed nearby the second conductive through via.

15. The electronic module as claimed in claim 11, wherein the circuit stack comprises:

a plurality of patterned conductive layers; and a plurality of dielectric layers alternately disposed with the patterned conductive layers, wherein a portion of the patterned conductive layer located on the upper surface constitutes the first upper trace and the second upper trace, and a portion of the patterned conductive layer located on the lower surface constitutes the first lower trace and the second lower trace.

16. The electronic module as claimed in claim 15, wherein materials of the dielectric layers are resin.

17. The electronic module as claimed in claim 16, wherein the high speed signal transmission interface comprises Universal Serial Bus 3.0 (USB 3.0), Serial Advanced Technology Attachment (SATA) or Peripheral Component Interconnection Express (PCIE).

18. The electronic module as claimed in claim 11, wherein an integrated circuit element comprises a control chip of high speed signal transmission interface.

19. The electronic module as claimed in claim 11, wherein an electrical connector comprises an electrical connector of high speed signal transmission interface.

20. The electronic module as claimed in claim 19, wherein the high speed signal transmission interface comprises USB 3.0, SATA or PCIE.

* * * * *